(12) United States Patent
Loh et al.

(10) Patent No.: US 8,645,876 B2
(45) Date of Patent: Feb. 4, 2014

(54) METHODOLOGY FOR PERFORMING POST LAYER GENERATION CHECK

(75) Inventors: Wye Boon Loh, Singapore (SG); Jeoung Mo Koo, Singapore (SG); Paul Kim Cheong Soh, Singapore (SG); Beng Lye Oh, Singapore (SG); Purakh Raj Verma, Casablanca (SG)

(73) Assignee: Globalfoundries Singapore Pte. Ltd., Singapore ( * ) Notice: Subject to any disclaimer, the term of this patent is extended or adjusted under 35 U.S.C. 154(b) by 0 days.

(21) Appl. No.: 13/234,117

(22) Filed: Sep. 15, 2011

(65) Prior Publication Data

US 2013/0074016 A1 Mar. 21, 2013

(51) Int. Cl.
*G06F 17/50* (2006.01)

(52) U.S. Cl.
USPC ................................. 716/52; 716/50; 716/55

(58) Field of Classification Search
USPC ............................... 716/50, 52, 55
See application file for complete search history.

(56) References Cited

U.S. PATENT DOCUMENTS

| | | | |
|---|---|---|---|
| 7,900,170 B2 * | 3/2011 | Suh et al. | 716/53 |
| 2005/0081179 A1 * | 4/2005 | Melvin | 716/20 |
| 2006/0136861 A1 * | 6/2006 | Lucas et al. | 716/21 |
| 2007/0094635 A1 * | 4/2007 | Suh et al. | 716/21 |
| 2009/0144686 A1 * | 6/2009 | Lensing et al. | 716/10 |

* cited by examiner

*Primary Examiner* — Stacy Whitmore
*Assistant Examiner* — Magid Dimyan
(74) *Attorney, Agent, or Firm* — Horizon IP Pte. Ltd.

(57) ABSTRACT

There is provided a method comprising receiving data corresponding to a layout design for a plurality of input mask layers and generating a layout design for at least one generated mask layer. The relationship between a first geometric element in a first layout pattern comprising one or more of the generated mask layers and a second geometric element in a second layout pattern is then determined and verified to check if they comply with predetermined rules. If the relationship does not conform with the predetermined rules the design of at least one of the generated mask layers associated with the first or second layout pattern is modified.

20 Claims, 8 Drawing Sheets

Fig. 1

| Mask Layer | Layer Name | Drawn/Generated | Digitized Area Polarity | Polygon Width (um) | Polygon Space (um) | Hole/ Resist Island (um$^2$) |
|---|---|---|---|---|---|---|
| L05 | Nwell | Drawn + Generated | Clear | -- | 0.62 | 1 |
| L15 | PField | Drawn + Generated | Clear | -- | 0.62 | 1 |
| L16 | NW1A | Drawn + Generated | Clear | -- | 0.62 | 1 |
| L28 | PVT | Generated | Clear | -- | 0.2 | 0.55 |
| L29 | NVT | Generated | Clear | -- | 0.2 | 0.55 |
| L2E | MVPVT | Generated | Clear | -- | 0.2 | 0.4 |
| L1L | MVNVT | Generated | Clear | -- | 0.2 | 0.4 |
| L38 | Dualgate | Generated | Clear | 0.62 | 0.7 | 1 |
| L61 | TN | Generated | Clear | -- | 0.2 | 0.4 |
| L64 | TP | Generated | Clear | -- | 0.2 | 0.4 |
| L59 | PreDope | Generated | Clear | -- | 0.2 | 0.115 |
| L70 | Pplus | Drawn + Generated | Clear | -- | 0.2 | 0.32 |

Table 1

Table 2

| Index | Mask | Layer Name | C1 COMP | C2 AD | C3 DNWELL | C4 Nwell | C5 PField | C6 NWlA | C7 PVlA | C8 NVT1 | C9 PVT1 | C10 PISCAp | C11 Dualgate | C12 preDope | C13 Poly2 | C14 TN1 | C15 TP1 | C16 Resistor | C17 MVPVT1 | C18 MVNVT1 | C19 Nplus | C20 Pplus | C21 ESD |
|---|---|---|---|---|---|---|---|---|---|---|---|---|---|---|---|---|---|---|---|---|---|---|---|
| R1 | 10 | COMP | x | x | x | x | x | x | x | x | x | x | x | x | x | x | x | □ | x | x | x | x | x |
| R2 | 11 | AD | - | x | x | x | x | x | x | x | x | x | x | x | x | x | x | □ | x | x | x | x | x |
| R3 | 06 | DNWELL | x | x | x | x | x | x | x | x | x | x | x | x | x | x | x | x | x | x | x | x | x |
| R4 | 05 | Nwell | x | x | x | x | □ | □ | □ | □ | □ | □ | □ | □ | x | □ | - | x | □ | □ | x | □ | □ |
| R5 | 15 | PField | x | x | x | x | x | □ | □ | - | □ | □ | x | x | x | - | □ | x | □ | □ | □ | x | □ |
| R6 | 16 | NWlA | x | x | x | □ | □ | x | □ | □ | □ | - | □ | x | x | □ | □ | x | □ | □ | □ | x | □ |
| R7 | 17 | PVlA | x | x | x | □ | □ | □ | x | □ | □ | □ | x | x | x | x | □ | x | □ | □ | x | x | - |
| R8 | 29 | NVT1 | x | x | x | □ | - | □ | □ | x | □ | □ | - | x | x | □ | □ | x | - | □ | □ | □ | □ |
| R9 | 28 | PVT1 | x | x | x | - | □ | □ | □ | □ | x | □ | - | □ | x | □ | x | x | □ | - | □ | □ | □ |
| R10 | 7D | PISCAP | x | x | x | □ | □ | - | □ | □ | □ | x | □ | - | x | - | □ | x | □ | □ | □ | □ | □ |
| R11 | 38 | Dualgate | x | x | x | □ | x | □ | x | - | - | □ | x | x | x | - | - | x | □ | □ | x | x | □ |
| R12 | 59 | Pre Dope | x | x | x | □ | x | x | x | x | □ | - | x | x | x | x | □ | x | □ | □ | x | □ | □ |
| R13 | 60 | Poly2 | x | x | x | x | x | x | x | x | x | x | x | x | x | x | x | x | x | x | x | x | x |
| R14 | 61 | TN1 | x | x | x | □ | - | □ | □ | - | □ | □ | - | x | x | x | □ | x | □ | □ | - | □ | □ |
| R15 | 64 | TP1 | x | x | x | - | □ | □ | □ | □ | - | □ | x | □ | x | □ | x | x | □ | □ | □ | - | □ |
| R16 | 63 | Resistor | □ | □ | x | x | x | x | x | □ | □ | □ | x | □ | x | □ | □ | x | □ | □ | □ | x | □ |
| R17 | 2E | MVPVT1 | x | x | x | □ | □ | - | □ | □ | □ | □ | □ | □ | x | □ | □ | x | x | □ | □ | - | □ |
| R18 | 1L | MVNVT1 | x | x | x | □ | □ | □ | - | □ | □ | □ | □ | □ | x | - | □ | x | □ | x | □ | □ | - |
| R19 | 65 | Nplus | x | x | x | x | x | x | x | □ | x | - | x | x | x | - | □ | x | □ | x | x | x | - |
| R20 | 70 | Pplus | x | x | x | x | x | x | x | □ | x | □ | x | □ | x | □ | - | x | - | □ | x | x | □ |
| R21 | 67 | ESD | x | x | x | □ | □ | □ | - | □ | □ | □ | □ | x | x | □ | □ | x | □ | □ | x | □ | x |

| Rule No. | Description |
|---|---|
| GRTN.A | (COMP AND (Poly2 AND (Nplus AND PField))) must be enclosed by TN. |
| GRTP.A | (COMP AND (Poly2 AND (Pplus AND Nwell))) must be enclosed by TP. |
| GRPreDope.A | ((Poly2 AND COMP) AND Nplus) must be enclosed by PreDope. |

Table 3

METHODOLOGY FOR PERFORMING POST LAYER GENERATION CHECK

TECHNICAL FIELD

The present invention relates to methods for generating physical design layout and verifying if they are in compliance with pre-defined layout rules.

BACKGROUND

With the scaling down of device dimensions, design methodologies that take into account the compatibility of a semiconductor chip design with the capabilities of manufacturing technologies that will be employed in the actual chip fabrication have become increasingly important. The disconnect between design and manufacturing often occurs at the physical layout design level where a circuit is converted from a schematic level to actual shapes that are used in the manufacture of masks for lithographic patterning.

In view of the above, design methodologies need to include robust physical design verification methods that are effective in detecting potentially yield impacting design elements. A known design verification technique involves checking whether the dimensions of design elements are within pre-defined limits of width, length, diameter and other geometrical dimensions. However, such verification techniques are not very efficient in detecting certain types of problematic layout pattern such as yield detractors caused by spatial relationship between design elements and abnormalities in the field area. In view of the above, design verification techniques that are more efficient in detecting potentially problematic layout are desired.

SUMMARY

In accordance with one embodiment of the invention there is provided a method comprising receiving data corresponding to a layout design for a plurality of input mask layers and generating a layout design for at least one generated mask layer. The relationship between a first geometric element in a first layout pattern comprising one or more of the generated mask layers and a second geometric element in a second layout pattern is then determined and verified to check if they comply with predetermined rules. If the relationship does not conform with the predetermined rules the design of at least one of the generated mask layers associated with the first or second layout pattern is modified.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

In the drawings, like reference numbers generally refer to the same parts throughout the different views. Also, the drawings are not necessarily to scale, emphasis instead generally being placed upon illustrating the principles of the invention. In the following description, embodiments of the invention will now be described, by way of example with reference to the drawings of which.

DETAILED DESCRIPTION

Methods for improving post layer generation check and hence effectiveness in detecting potential yield reducing issues are provided. In general terms, these methods involve providing predefined rules on the relationship between geometric elements found in at least one generated mask layer and a second layout pattern. The spatial relationships may include rules such as defining the minimum overlap required, maximum amount of overlap permissible, the minimum separation distance between geometric elements belonging to two separate layout patterns. Other types of predefined rules may also be suitable. The predefined rules are read in by a processor which checks respective layout patterns for conformance to these rules. The checks may be performed in a post layer generation check. Violations are detected and flagged so that appropriate action such as modifications to layer generation algorithm may be taken and non-conforming layers regenerated until rule conformance is achieved.

Figure 1:
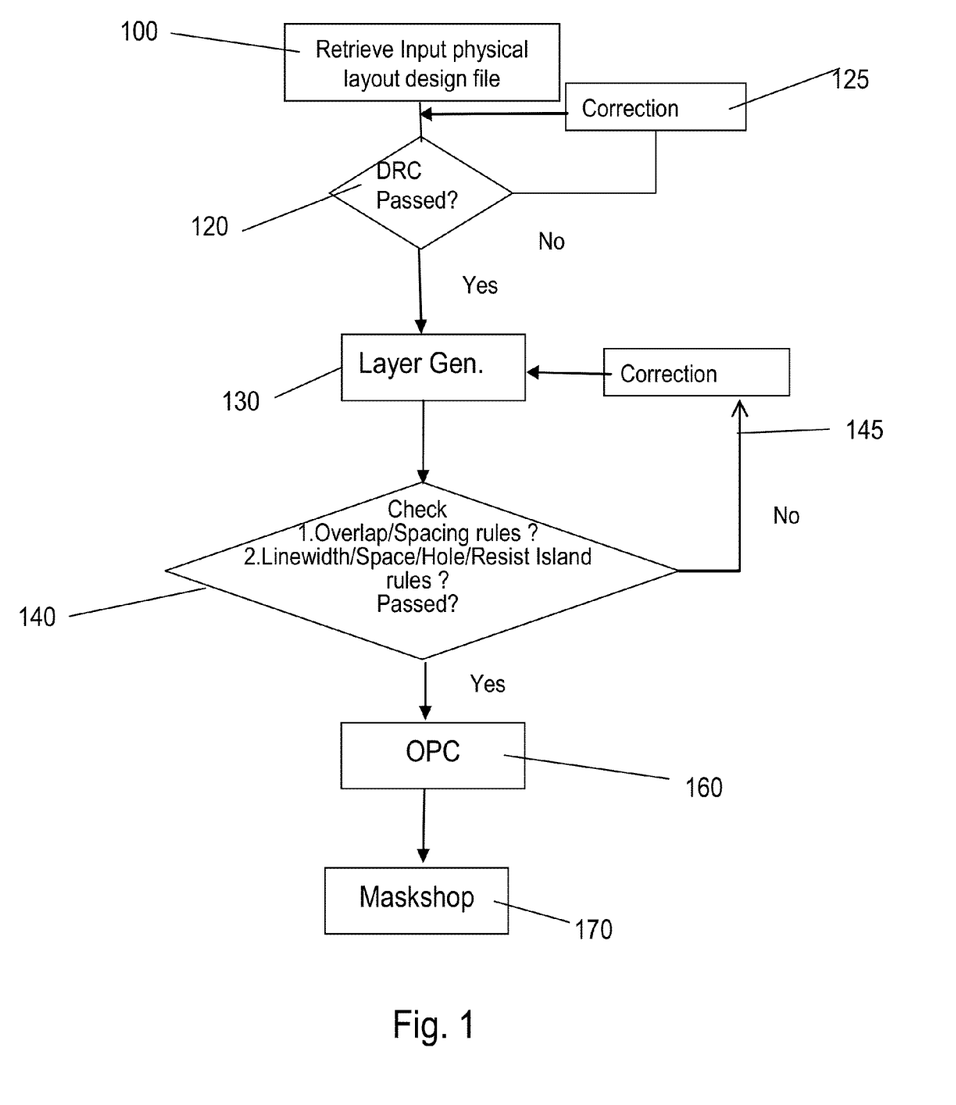
FIG. 1 is a flow chart in accordance with an embodiment of the invention. It illustrates a method of generating and checking a physical layout design before the final layout is sent to a maskshop for mask fabrication.

FIG. 1 is a flowchart illustrating a method for generating and checking a semiconductor circuit design in accordance with one embodiment of the invention. In a first step 100, an input layout design file containing the physical layout of the geometric elements that will be used to fabricate mask layers for the circuit design is retrieved. As is known to one skilled in the art, the pattern for each mask layer is subsequently reproduced on a lithographic mask and the lithographic mask is used to pattern resist layers during the fabrication of a semiconductor device. The input layout design file may be in the form of a GDS database file where planar geometric shapes, text and other information are represented in a binary file format. Alternatively, the input layout design file may also be stored in a different data format. The input layout design file which may be known as a $GDS_{in}$ file may include the physical layout for all or just a subset of the mask layers needed to manufacture the semiconductor circuit design. In one embodiment, the input layout design file may be provided by a foundry customer.

In step 120, the layout for the various mask levels in the input layout design file is subjected to a design rule check. This entails retrieving the relevant design rule specification and generating a design rule checking deck that determines if predefined design rules are observed. These predefined design rules may include limitations on the length, width and area of geometric elements as well as spatial separation between adjacent geometric elements on the same mask layer. When a design rule violation is detected in step 120, the process loops to step 125 where a correction to the layout is made to rectify the detected violation before proceeding back to step 120 to continue with the design rule check. The process of checking and rectification may occur iteratively until the violation is rectified through design modification. Alternatively, the correction step 125 may also involving making a waiver on the error detected. When all the mask layers in the input layout design file that require verification have been checked and there are no further design rule violations detected, the process proceeds to step 130.

In step 130, a layer generation algorithm is implemented. The layer generation algorithm may generate the physical layout for mask layers not present in the input physical design or $GDS_{in}$ file. The generation of features is based on layer generation rules which may be applied in conjunction with reference points or rules present in the $GDS_{in}$ file. In addition to or as an alternative to generating the layout for missing mask layers, the layer generation algorithm may also modify the layout of mask layers already existing in the input layout design file. This modification includes but is not limited to the scaling the size of geometric elements, varying the spatial relationship between geometric elements and adding new geometric elements. The modification of input layout design file mask layers is typically performed so that the specific foundry's process conditions are factored into the layout design thereby potentially improving the yield of devices being fabricated. The output from the layer generation step 130 comprises one or more generated mask layers each mask layer being a newly generated mask layer or a modification of a mask layer pre-existing in the input layout design file.

After layer generation is completed in step 130, a post layer generation check is carried out in step 140. In general, the post layer generation check determines if the relationship between geometric elements in a first layout pattern comprising at least one generated mask layer and geometric elements in second layout pattern are in conformance with predefined rules. The second layout pattern could be another generated mask layer, a mask layer from the input layout design file, a modified version of a mask layer from the input layout design file or a combination thereof.

In one embodiment, this layer generation check includes an Overlap/Spacing Algorithm that checks if the spatial relationship between geometric elements found on different layout patterns are in compliance with a set of predefined rules on the overlap and spacing required or permissible. In one embodiment, the first layout pattern is superimposed on the second layout pattern and the spatial relationship between geometric elements on the two layers are checked to see if they conform with predefined Overlap/Spacing rules. Examples of predefined rules include limitations on the minimum amount of required overlap required, maximum amount of overlap allowed and minimum separation distance required. In one embodiment, the first layout pattern corresponds to a generated mask layer while the second layout pattern is a physical layout that is generated based on performing a logical operation on the layout of multiple mask layers. This allows for a designer to check on specific type of devices such as transistors, diodes, and capacitors and verify if a generated mask layer is overlapping a specific device or component of a specific device in the correct manner. One or more of the rules may be defined based on limitations imposed by the fabrication process.

Figure 2:
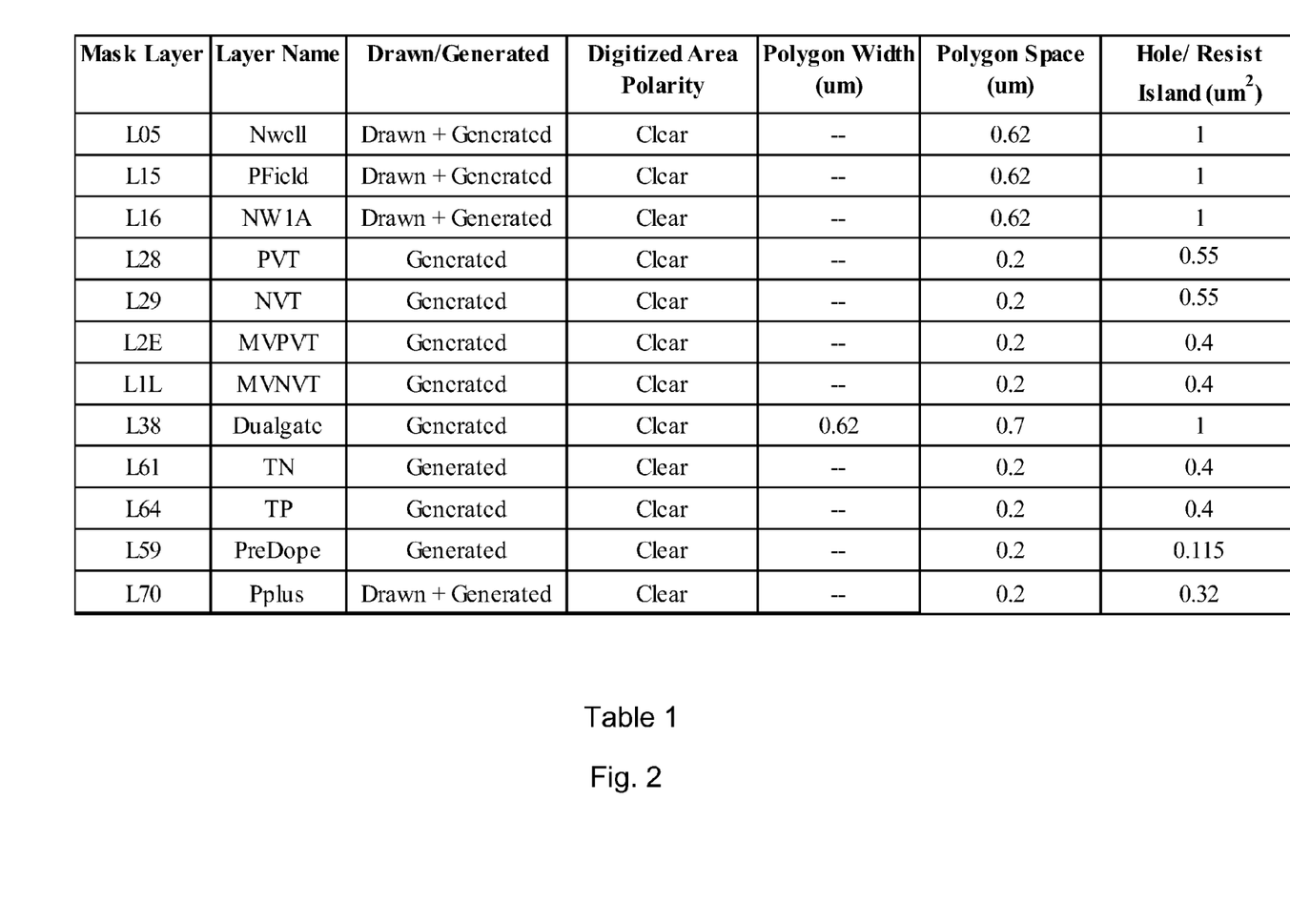
FIG. 2 (Table 1) is an exemplary minimum dimension design rule table.

In addition to the above, the post layer generation check may also include a dimension algorithm that checks to see if the geometric elements in one or more generated mask layers are in compliance with dimensions of linewidth, space, hole or resist island limits specified in a set of predefined design rules. Such rules may include minimum dimension specifications as shown in FIG. 2 (Table 1). The layers marked as Drawn+Generated correspond to generated mask layers that already exist in the original input layout design file but have been modified by the layer generation process in step 130 of FIG. 1. The layers only marked as Generated correspond to newly generated mask layers that do not pre-exist as a mask layer in the input layout design file. The dimension algorithm in the post layer generation will check to see if any of the mask layers in Table 1 include shapes that are smaller than the specified values in Table 1. In addition to the above mentioned minimum dimension rules, the dimension algorithm may additionally or alternatively require geometrical elements to have dimensions that fall with a range of values or exceed a certain value.

When the post layer generation check in step 140 detects a violation of predefined rules, the process loops to step 145 where the violation is reviewed. Corresponding revisions are made to the layer generation algorithm of one or more mask layers to address the violation. The mask layers where the layer generation algorithm has been amended are then regenerated to produce a modified layout before proceeding back to step 140 to continue with the layer generation check. Layers in addition to those with layer generation algorithm amendments such as layers which make reference to the regenerated layers may also be regenerated before continuing with the layer generation check. In one embodiment, it is also possible to re-generate all the mask layers being generated by the layer generation process in step 130.

In step 160, optical proximity correction (OPC) features are added to the layout of one or more mask layers. The resulting post OPC layout design file may be converted to a different format before it is sent to a maskshop for mask fabrication in step 170. For example, the post OPC layout design file may be converted from a GDS to a MEBES file format.

In order to enable the post layer generation Overlap/Spacing algorithm in the step 140 of FIG. 1, an Overlap/Spacing table containing rules on the required or permissible amount of overlap and/or spacing between two or more different layout patterns is required. The Overlap/Spacing table and any other physical design rule tables such as Table 1 may be fed into a generation rule check compiler which generates a checking algorithm based on the tables.

Figure 3:
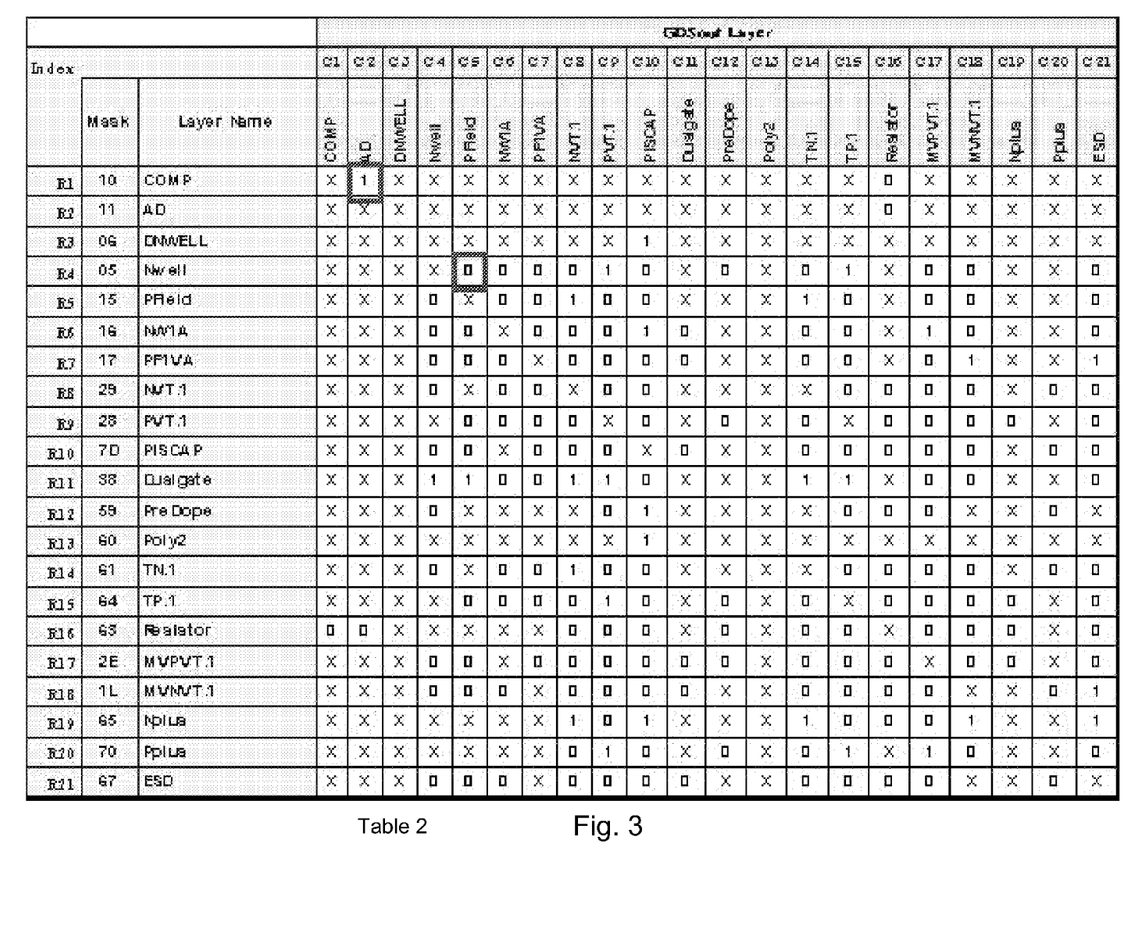
FIG. 3 (Table 2) is an Overlap/Spacing table in accordance with one embodiment of the invention.

FIG. 3 (Table 2) is an exemplary Overlap/Spacing table in the form of a matrix where a listing of mask layers is provided on both a horizontal axis (Mask Layer A) and a vertical axis (Mask Layer B). The mask layers listed on the both axes in Table 2 are identical and they include generated mask layers obtained from the layer generation process in step 130. In addition to this, the Overlap/Spacing rule table may also include mask layers that pre-exist in the input layout design file and are not modified by the layer generation step.

Figures 4A, 4B:
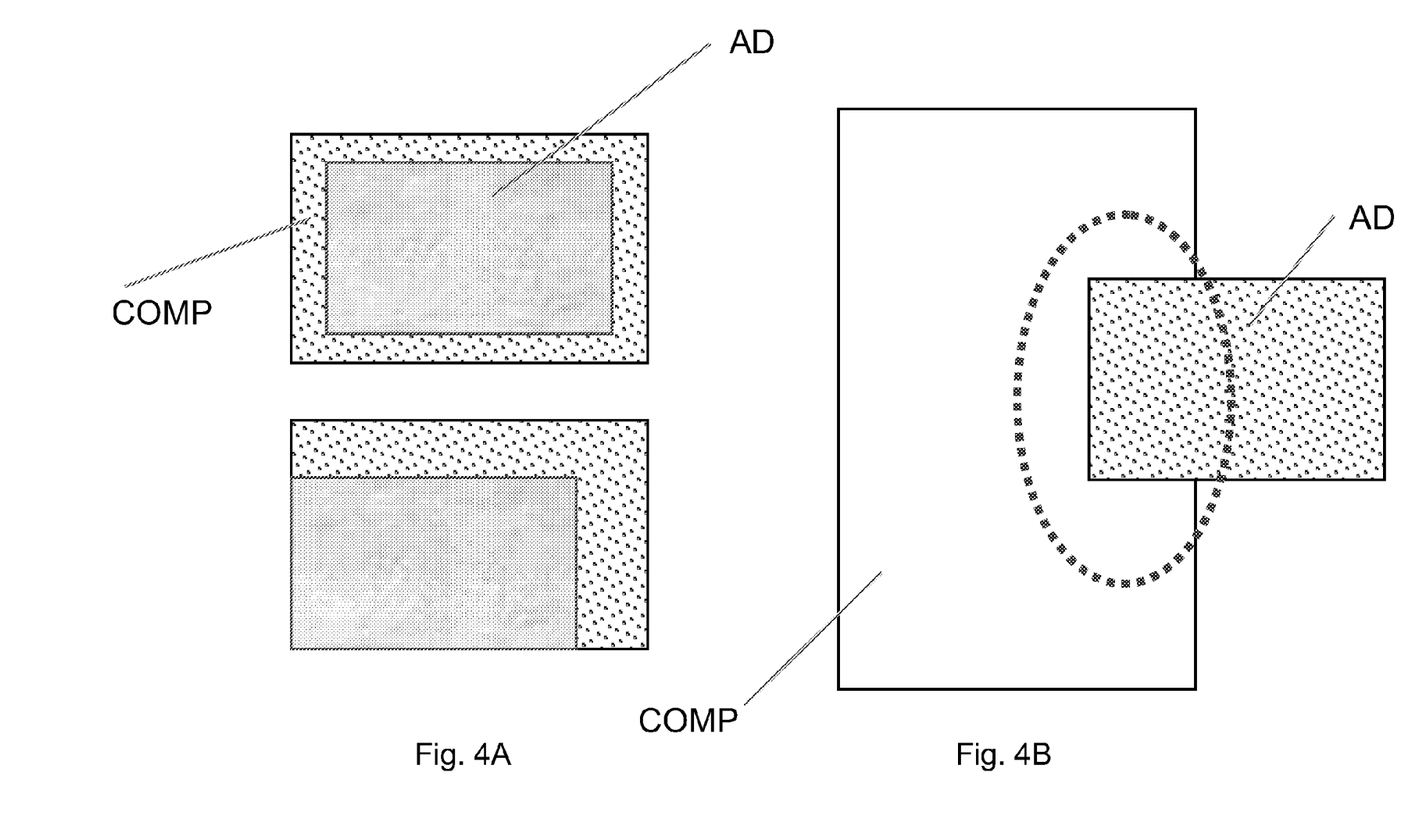
FIGS. 4A and 4B are examples of overlapping geometric elements belonging to different mask levels in one embodiment.

An "X" marking on a cell indicates that there is no spatial requirement for the combination of Mask Layer A and B associated with that cell. A "1" marking indicates that the Mask Layer A layer associated with that cell must be overlapped by the corresponding Mask Layer B. For example in Table 2, the Mask Layer A (AD) must be overlapped by the active area mask layer called COMP. The amount of overlap required may be specified in the Overlap/Spacing algorithm and it may vary from requiring the AD layer geometric elements to be completely encompassed by a COMP layer shape as shown in FIG. 4A to just a partial overlap as shown in FIG. 4B. If the generation rule check finds an AD polygon completely outside a COMP polygon or the amount of overlap is less than the specified amount, there is an Overlap/Spacing violation. The layer generation algorithm used to create at least one of the mask layers involved in the comparison (AD and/or COMP) will have to be revised, the affected mask layer(s) re-generated and looped back again to check if the overlap specification is met.

Figure 5A:
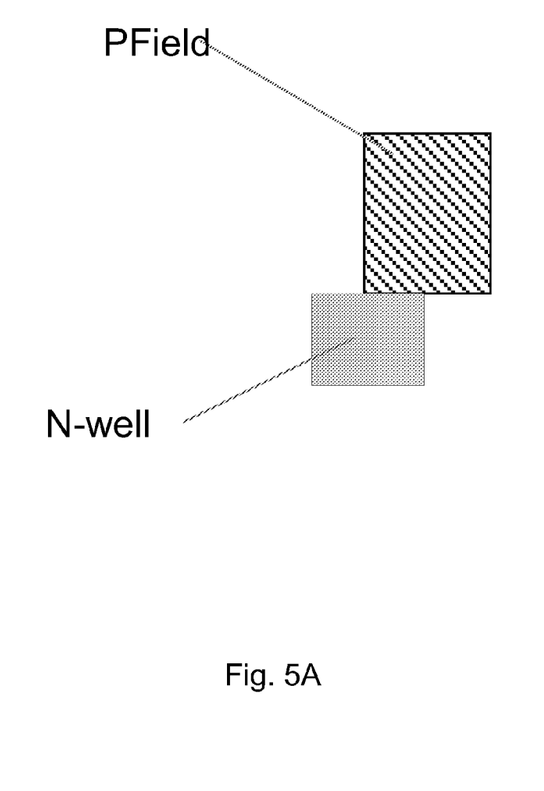
FIG. 5A-5C are examples of geometric elements belonging to different mask levels in another embodiment.
Figure 5B:
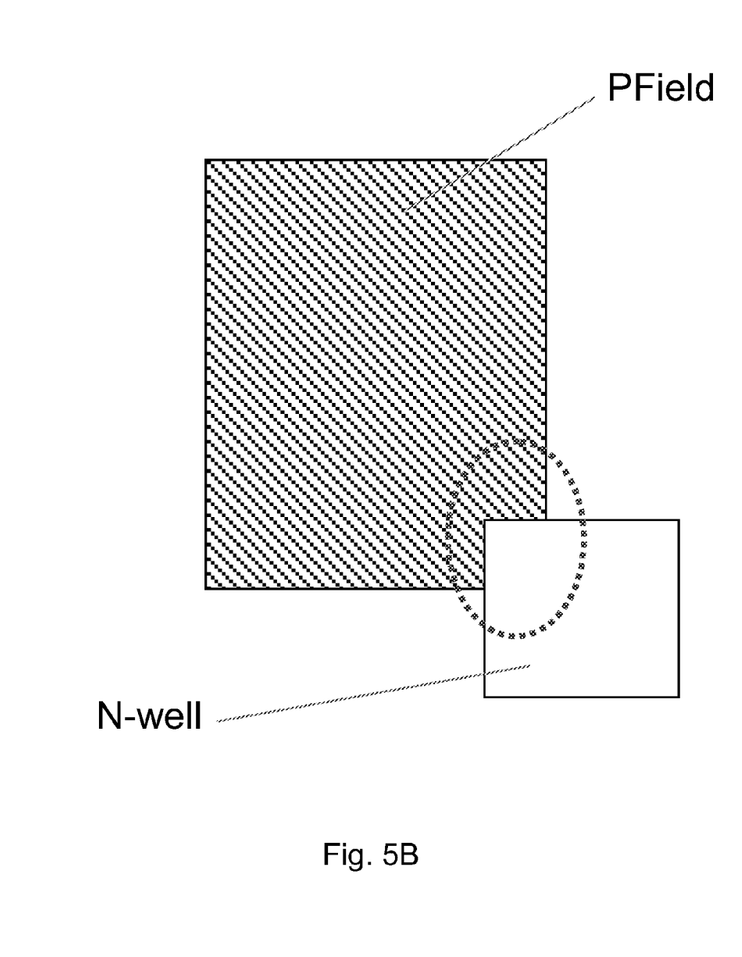

A "0", on the other hand, indicates that the geometric elements in Mask Layers A and B associated with the cell must not have a degree of overlap exceeding a predefined value or the geometric elements must be separated by a pre-defined amount. For example, it is possible to specify that Mask Layer A layer PField and Mask layer B, N-well must not overlap at all. The layout in FIG. 5A will pass since the boundaries of the two shapes abut without touching. However, if the generation rule check finds an overlap such that shown in FIG. 5B, there is an Overlap/Spacing violation. The layer generation algorithm used to create at least one of the PField or N-well mask layers will have to be revised, the affected mask layer re-generated and checked again in Step 140 to verify if the non-overlap specification is met. In one embodiment, some degree of overlap between the mask layers may be permitted for a cell indicated as "0" but it must not exceed the amount pre-defined in the algorithm.

Figure 5C:
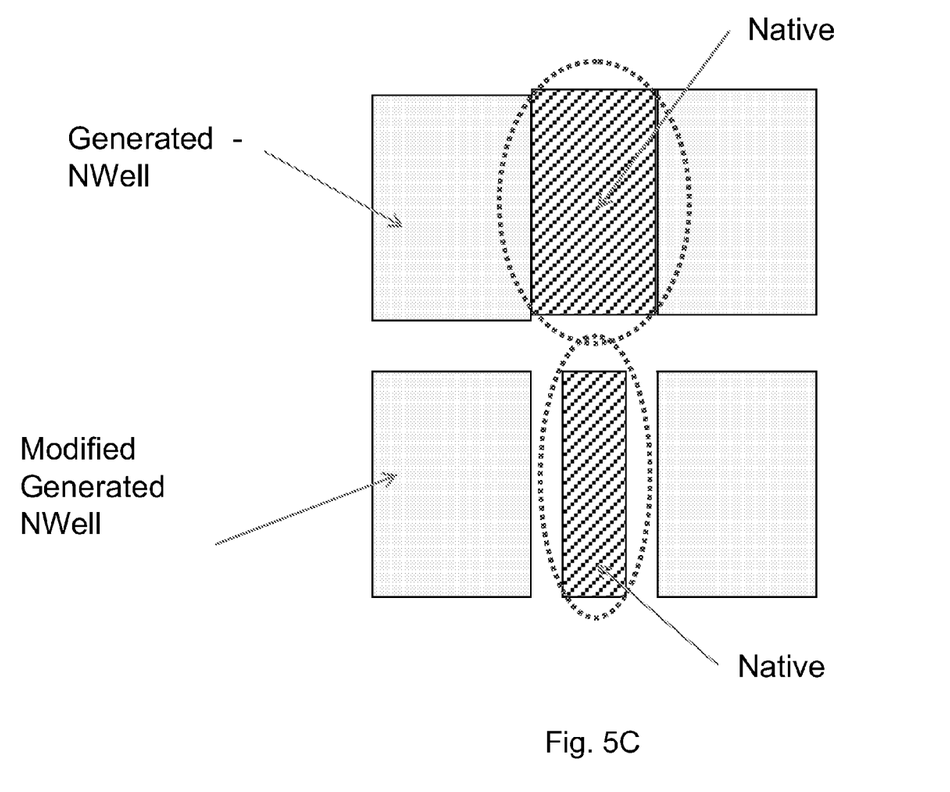

FIG. 5C shows an example of a spacing rule associated with a "0" value. The spacing rule may specify a minimum spacing of 1 micrometer between a non-chrome area (assuming a positive resist is used in fabrication) in a generated n-well mask and a non-chrome area in a native mask layer. The generated Nwell mask layer is a generated by modifying an Nwell mask layer that is included in the input layout design file. The Nwell mask layer may or may not be modified as a result of the DRC check in Step 120. The native mask layer in this instance also exists in the input layout design file but is not modified by the layer generation step 130. The Nwell mask was scaled up in size during layer generation and as a result of that the sides of a non-chrome geometric element in the Native mask abut a boundary of the a non-chrome geometric element in the Nwell mask (see top drawing in FIG. 5C). This spatial relationship between the geometrical elements in the two mask layers is flagged as a violation during the layer generation check. As a result, the violation is reviewed and the Nwell mask algorithm is modified so that an Nwell mask layer that is in compliance with the 1 micron spacing rule is produced. The bottom drawing in FIG. 5C shows a Nwell layout generated using a modified layer generation alogithm. As shown there is a space between the Nwell geometric non-chrome elements and adjacent Native layer geometric element. If the spacing meets Spacing rules, the layer generation check goes on to compare a different pair of mask layers or if all layers have been compared, the method proceeds to the OPC step. On the other hand, if the spacing requirements are still not met, the Nwell layer generation algorithm is modified again and the above steps repeated iteratively until there is compliance with the rules.

The layout being compared is not just limited to the discrete mask layer example shown in Table 2. It is also possible to have layout patterns that are generated by performing a logical operation on a plurality of mask layers. Furthermore, it is to be appreciated that the Overlap/Spacing rules used in post layer generation check may configured so that both active device areas and isolation regions in chip are checked.

Figure 6:
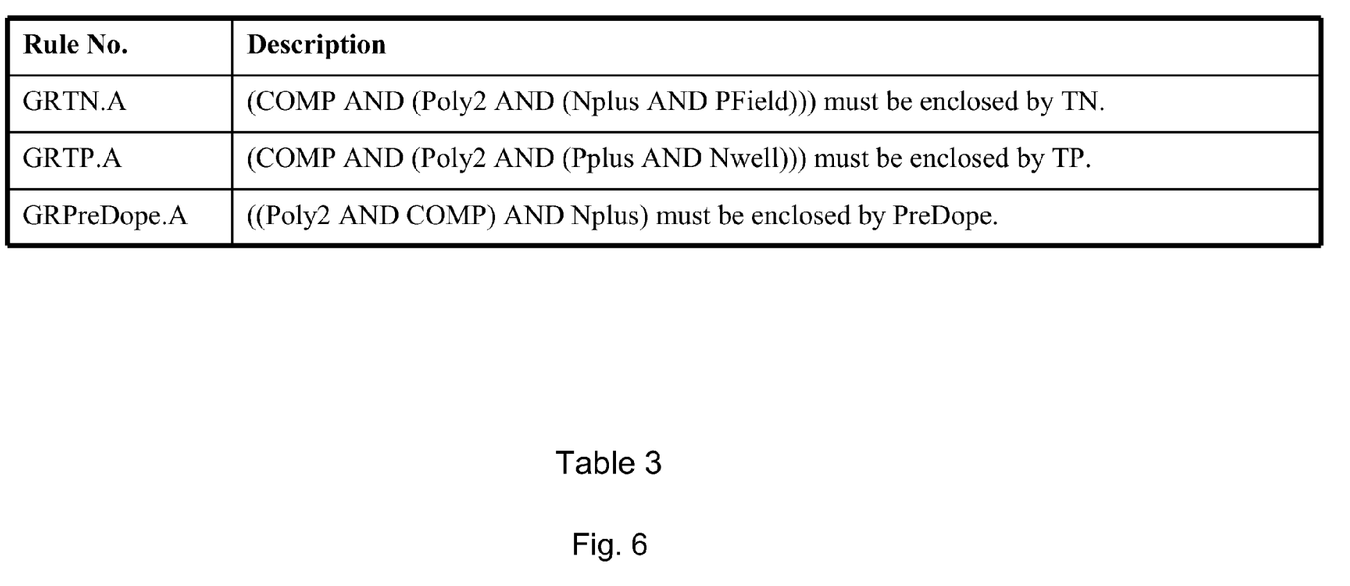
FIG. 6 (Table 3) illustrates Overlap/Spacing rules in accordance with an embodiment of the invention where one of the layout patterns is formed by performing logical operations on multiple mask layers.

In one embodiment, the Overlap/Spacing Algorithm is used to check if specific device features are overlapped by a certain mask level. FIG. 6 (Table 3) shows a rule GRTN.A that can be used in an Overlap/Spacing Algorithm to check if NMOS gate electrodes are enclosed by non-chrome geometric elements in a thin-gate NMOS LDD mask layer, TN. The NMOS gate electrodes on an integrated circuit layout may be extracted by performing a logical operation in the form of (COMP AND (Poly2 AND (Nplus AND PField))) on mask layers COMP, Poly2, Nplus and PField. The logical operation Nplus AND PField for example identifies shapes, S1 that are derived from an overlap of the Nplus and PField. The overlap between shapes S1 and shapes on the Poly2 features then creates further shapes S2 of which the overlap with the COMP mask features gives the final NMOS gate electrodes. The final shapes extracted from the logical equation form a first layout pattern. During the execution of the Overlap/Spacing algorithm, the spatial relationship between geometric elements in the first layout pattern and mask layer TN is determined and checked to verify if the NMOS gate electrodes are all enclosed by the TN mask layer.

Overlap/Spacing rule GRTP.A has a similar enclosure requirement but in this instance it is the PMOS poly gate structures that have to be enclosed within non-chrome geometric elements in a Thin-gate PMOS LDD layer, TP mask layer. A first layout pattern is generated based on a logical operation (COMP AND (Poly2 AND (Pplus AND Nwell))) on mask layers COMP, Poly2, Pplus and Nwell. The first layout pattern is then superimposed on the TP mask layer and checked to see if the geometric elements, PMOS poly gate structures are enclosed by the non-chrome areas on the TP mask layer.

A third Overlap/Spacing rule, GRPreDope.A, in Table 3 is used to check rule if NMOS devices is formed by COMP, Poly2 & Nplus mask layers is enclosed by the PreDope mask layer. The logical operation ((Poly2 AND COMP) AND Nplus) is used to extract the relevant NMOS devices and produce a first layout pattern with these devices as geometric elements. The geometric elements in the first layout pattern have to be enclosed by specified geometric elements in the PreDope mask layer. Although the rules in Table 3 only show the use of the AND logical operator, it may also be possible to use other logical operators such as "OR", "NOR", "NAND".

Figure 7:
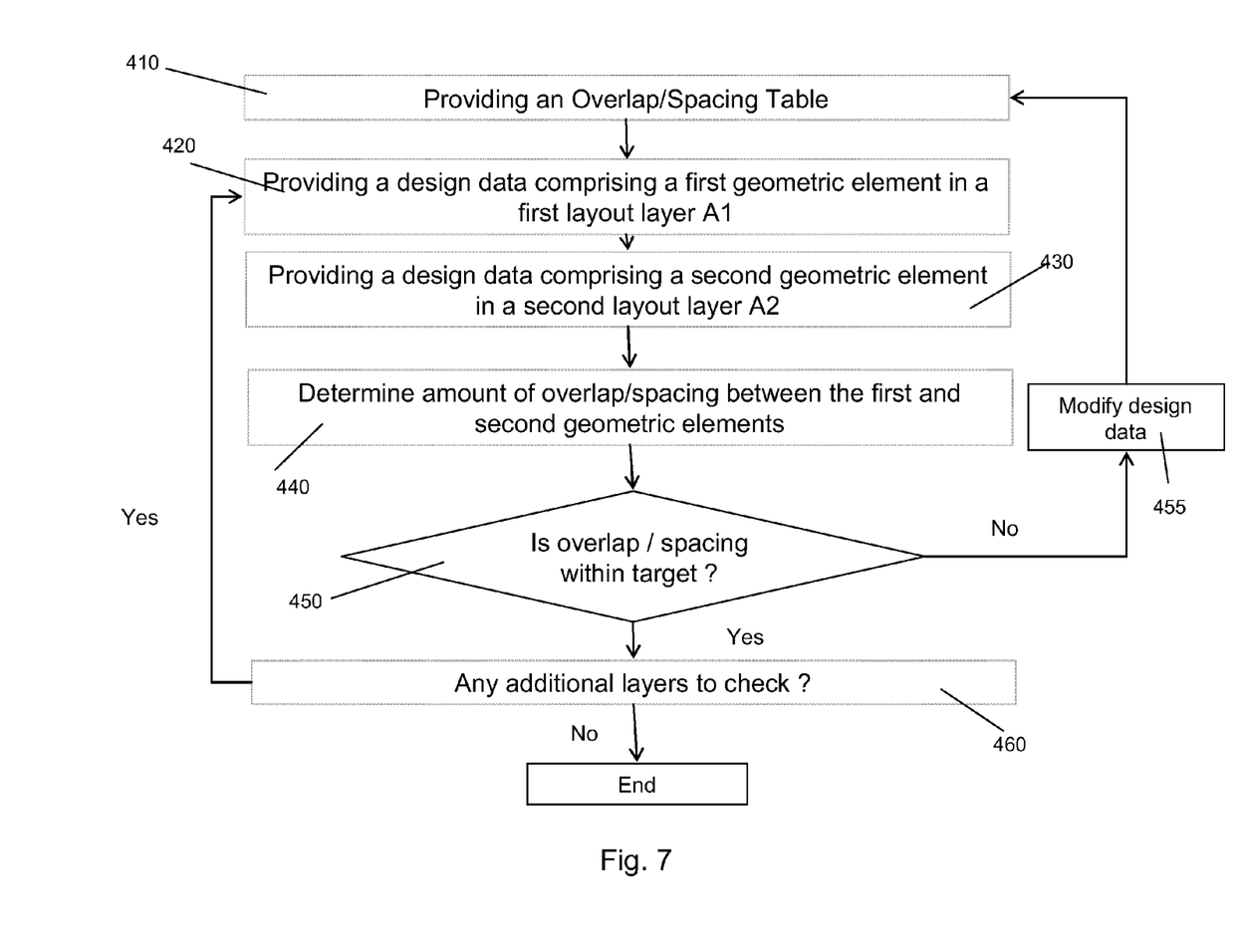
FIG. 7 is a flow chart showing a method of performing an Overlap/Spacing algorithm in accordance with an embodiment of the invention.

FIG. 7 is a flowchart illustrating an exemplary Overlap/Spacing Algorithm in step 140 of FIG. 1. In step 410, an Overlap/Spacing table containing rules on the amount of Overlap/Spacing between two or more different layout patterns is read by a layer generation check algorithm. In step 420, design data of a first layout pattern, A1 listed in the Overlap/Spacing table is provided. A1 comprises a first geometric element. In step 430, design data of a second layout pattern, A2 listed in the Overlap/Spacing table is provided. A2 comprises a second geometric element. At least one of A1 and A2 is derived based on a generated mask layer. In one embodiment, at least one of A1 or A2 may formed by performing a logical function on the layout of two or more mask layers used in the fabrication of integrated circuits. In step 440, the amount of overlap or spacing between the first and second shape is calculated.

After the amount of overlap or spacing is determined, step 450 is performed to verify if the spatial relationship is compliant with the limits specified in the Overlap/Spacing table. If the overlap or spacing is not within specified limits, the design data for one or more of the layers that make up A1 and A2 is modified to improve compliance with the Overlap/Spacing design rules. Modification of design data is achieved by amending the associated layer generation algorithm in step 455 and regenerating the design data. The amended design data is run through the layer generation check and this process of checking, modification and re-generation may be iteratively applied until compliance with the Overlap/Spacing rules is achieved. If the spatial relationship between the shapes in layers A1 and A2 comply with the Overlap/Spacing rules, the flow sequence proceeds to step 460 to check if there are any additional layers to be checked. If there are additional layers to be checked, the flow goes back to 420. Otherwise, the Overlap/Spacing Algorithm ends.

The above described Overlap/Spacing Algorithm provides an automated and consistent checking method that is superior to manual checks which are tedious, time consuming and reliant on the knowledge of the person doing the check. Layer to layer relationships can be pre-defined and the entire layout of a chip can be checked within a relatively short time.

The preferred embodiment of the invention is illustrative of the invention rather than limiting of the invention. It is to be understood that revisions and modifications may be made to methods, materials, structures and dimensions of a semiconductor structure while still providing a semiconductor that fall within the scope of the included claims. All matters hitherto set forth herein or shown in the accompanying drawings are to be interpreted in an illustrative and non-limiting sense.

The invention claimed is:

1. A computed-implemented method comprising:
    retrieving, by a processor, an input layout design which comprises data of a plurality of input mask layers;
    checking, by the processor, whether the layout design of the plurality of the input mask layers complies with predetermined design rules;
    rectifying, by the processor, the layout design of the input mask layers if any design rule violation is detected;
    generating, by the processor, a layout design for at least one generated mask layer based on layer generation rules after checking and rectifying of the layout design of the input mask layer;
    determining, by the processor, whether the relationship between a first geometric element in a first layout pattern comprising one or more of the generated mask layers and a second geometric element in a second layout pattern complies with predetermined rules; and
    modifying, by the processor, the layout design of at least one of the generated mask layers associated with the first or second layout pattern if the relationship does not comply with the predetermined rules.

2. The computer-implemented method according to claim 1 further comprising checking if the modified design layout is in compliance with the predetermined rules.

3. The computer-implemented method according to claim 1, wherein generating the layout design comprises at least one of: modifying the input layout design or generating a layout design for a mask layer that is not one of the input mask layers.

4. The computer-implemented method according to claim 3, wherein modifying the input layout design comprises scaling the size of geometric elements on the input mask layer, varying the spatial relationship between geometric elements or adding new geometric elements.

5. The computer-implemented method according to claim 1, wherein at least one of the first or second layout pattern is a composite of multiple mask layers and is derived from performing a logical operation on the input layout design.

6. The computer-implemented method of claim 5, wherein the layout design of the composite of the multiple mask layers corresponds to a transistor feature or a transistor.

7. The computer-implemented method according to claim 5, wherein the composite of the multiple mask layers includes at least one generated mask layer.

8. The computer-implemented method according to claim 1, wherein one of the first or second layout pattern is a discrete mask layer, and the other layout pattern is a composite of multiple mask layers, wherein the composite mask layer is derived from performing a logical operation on the layout design of a plurality of mask layers.

9. The computer-implemented method according to claim 1, wherein determining whether the relationship complies with predetermined rules comprises determining the amount of overlap between the first and second geometric elements.

10. The computer-implemented method according to claim 9, wherein the predetermined rules require the separation distance between the first and second geometric elements to be within a specified range.

11. The computer-implemented method according to claim 9, wherein the predetermined rules require the first and second geometric elements to overlap and the amount of overlap falls within a specified range.

12. The computer-implemented method according to claim 11, wherein the predetermined rules require one of the first or second geometric element to be encompassed by the other first or second geometric element.

13. The computer-implemented method according to claim 1, wherein determining whether the relationship complies with predetermined rules comprises determining the amount of separation distance between the first and second geometric elements.

14. The computer-implemented method according to claim 1 wherein
    the predetermined design rules include limitations on length, width, area of geometric elements or spatial separation between adjacent geometric elements on the same input mask layer.

15. The computer-implemented method according to claim 1, further comprising using a photolithographic mask with a layout design that is based on one of the generated mask layer to pattern an integrated circuit structure.

16. The computer-implemented method according to claim 1, further comprising determining whether the dimensions of the first and second geometric elements comply with pre-defined values.

17. A method of forming a semiconductor device comprising:
    retrieving, by a processor, an input layout design comprises data of a plurality of input mask layers;
    checking, by the processor, whether the layout design of the plurality of the input mask layers complies with predetermined design rules;
    rectifying, by the processor, the layout design of the input mask layer if any design rule violation is detected;
    generating, by the processor, a layout design for at least one generated mask layer based on layer generation rules after checking and rectifying the layout design of the input mask layer;
    determining, by the processor, whether the relationship between a first geometric element in a first layout pattern comprising one or more of the generated mask layers and a second geometric element in a second layout pattern complies with predetermined rules;
    modifying, by the processor, the layout design of at least one of the generated mask layers associated with the first or second layout pattern if the relationship does not comply with the predetermined rules; and
    fabricating mask layers using the modified layout design.

18. The method of claim 17 further comprising patterning resist layers of the semiconductor device using the mask layers.

19. The method of claim 18 wherein generating the layout design comprises at least one of: modifying the input layout design or generating a layout design for a mask layer that is not one of the input mask layers.

20. The method of claim 19, wherein modifying the input layout design comprises scaling the size of geometric elements on the input mask layer, varying the spatial relationship between geometric elements or adding new geometric elements.

* * * * *